(12) United States Patent
Takaya et al.

(10) Patent No.: US 10,522,627 B2
(45) Date of Patent: Dec. 31, 2019

(54) SEMICONDUCTOR DEVICE

(71) Applicant: TOYOTA JIDOSHA KABUSHIKI KAISHA, Toyota-shi, Aichi (JP)

(72) Inventors: Hidefumi Takaya, Toyota (JP); Yasushi Urakami, Kariya (JP); Narumasa Soejima, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/027,825

(22) Filed: Jul. 5, 2018

(65) Prior Publication Data
US 2019/0067420 A1 Feb. 28, 2019

(30) Foreign Application Priority Data

Aug. 23, 2017 (JP) .................. 2017-160462

(51) Int. Cl.
| | |
|---|---|
| H01L 29/00 | (2006.01) |
| H01L 29/10 | (2006.01) |
| H01L 29/423 | (2006.01) |
| H01L 29/06 | (2006.01) |
| H01L 29/78 | (2006.01) |
| H01L 29/739 | (2006.01) |

(52) U.S. Cl.
CPC ...... *H01L 29/1095* (2013.01); *H01L 29/0688* (2013.01); *H01L 29/0696* (2013.01); *H01L 29/1045* (2013.01); *H01L 29/4236* (2013.01); *H01L 29/42368* (2013.01); *H01L 29/7397* (2013.01); *H01L 29/7813* (2013.01)

(58) Field of Classification Search
None
See application file for complete search history.

(56) References Cited

U.S. PATENT DOCUMENTS

2010/0224932 A1 9/2010 Takaya et al.

FOREIGN PATENT DOCUMENTS

JP 2007-242852 A 9/2007

*Primary Examiner* — Reema Patel
(74) *Attorney, Agent, or Firm* — Oliff PLC (57) ABSTRACT

A semiconductor device may be provided with a semiconductor substrate, an upper electrode, a lower electrode and a gate electrode provided within a trench via a gate insulator film. The semiconductor substrate may include a p-type body layer being in contact with the upper electrode, an n-type drift layer intervening between the body layer and the lower electrode, a p-type floating region provided along a bottom surface of the trench, and a p-type connection region extending between the body layer and the floating region along a side surface of the trench. The trench may include a first section where the connection region is not provided and a second section where the connection region is provided. An inclination angle of the side surface of the trench in the second section may be greater than an inclination angle of the side surface of the trench in the first section.

7 Claims, 10 Drawing Sheets

SEMICONDUCTOR DEVICE

CROSS-REFERENCE

This application claims priority to Japanese patent application No. 2017-160462, filed on Aug. 23, 2017, the entire contents of which are incorporated herein by reference.

TECHNICAL FIELD

The technique disclosed herein relates to a semiconductor device, in particular, to a trench-gate-type semiconductor device. The term "trench-gate-type semiconductor device" herein means a semiconductor device including a semiconductor substrate, a trench provided in the semiconductor substrate, and a gate electrode provided within the trench and insulated from the semiconductor substrate. The trench-gate-type semiconductor device encompasses, for example, a MOSFET (metal-oxide-semiconductor field-effect transistor) and an IGBT (insulated gate bipolar transistor).

BACKGROUND

Japanese Patent Application Publication No. 2007-242852 describes a trench-gate-type MOSFET. This MOSFET includes a semiconductor substrate including a trench in an upper surface of the semiconductor substrate, an upper electrode provided on the upper surface of the semiconductor substrate, a lower electrode provided on a lower surface of the semiconductor substrate, and a gate electrode provided within the trench via a gate insulating film. The semiconductor substrate includes a p-type body layer being in contact with the upper electrode, an n-type drift layer intervening between the body layer and the lower electrode, a p-type floating region located within the drift layer and provided along a bottom surface of the trench, and a p-type connection region extending between the body layer and the floating region along a side surface of the trench.

In the MOSFET described above, the floating region is provided along the bottom surface of the trench and the connection region connecting the floating region to the body region is provided along the side surface of the trench. Such a configuration alleviates electric field strength near the bottom surface of the trench when the MOSFET is turned off, and thus the MOSFET withstands a higher voltage. Further, when the MOSFET is turned on, holes are quickly introduced into the floating region from the body layer through the connection region, and thus a charge-up phenomenon in the floating region is suppressed.

SUMMARY

On the other hand, it is relatively difficult to form a connection region along a side surface of a trench. In order to form a connection region along a side surface of a trench, it is necessary to perform ion implantation of p-type impurity into the side surface of the trench through an opening of the trench. Since an opening width of the trench is relatively narrow, the ion implantation into the side surface of the trench (especially, into the side surface of the trench excluding both of longitudinal ends of the trench) is possible only at a shallow incidence angle, inevitably. Since ion implantation at a shallow incidence angle is less likely to allow ions to be implanted into the semiconductor substrate, it is necessary, for example, to increase accelerating energy that is imparted to the ions. However, increasing the accelerating energy that is imparted to the ions may cause a problem that crystal defects within the semiconductor substrate increase, for example. As seen from the above, it is relatively difficult to form the connection region along the side surface of the trench.

The disclosure herein provides a technology that is capable of easily forming a connection region along a side surface of a trench in a trench-gate-type semiconductor device.

The technology disclosed herein is embodied by a semiconductor device. This semiconductor device may comprise a semiconductor substrate comprising a trench in an upper surface of the semiconductor substrate, an upper electrode provided on the upper surface of the semiconductor substrate, a lower electrode provided on a lower surface of the semiconductor substrate, the lower surface being located at an opposite side of the upper surface, and a gate electrode provided within the trench via a gate insulator film. The semiconductor substrate may comprise a p-type body layer being in contact with the upper electrode, an n-type drift layer intervening between the body layer and the lower electrode, a p-type floating region provided within the drift layer and provided along a bottom surface of the trench, and a p-type connection region extending between the body layer and the floating region along a side surface of the trench. The trench may comprise, along a longitudinal direction of the trench in a planer view, a first section where the connection region is not provided and a second section where the connection region is provided. Moreover, an inclination angle of the side surface of the trench in the second section may be greater than an inclination angle of the side surface of the trench in the first section.

Here, the inclination angle of the side surface of the trench means an angle that the side surface of the trench forms with respect to a depth direction of the trench. In particular, on the basis of the side surface of the trench being parallel to the depth direction (that is, the inclination angle is zero), it is assumed that the inclination angle becomes greater as the side surface of the trench more inclines so as to face an upper surface side of the semiconductor substrate.

In the semiconductor device described above, the side surface of the trench has a great inclination angle in a section (i.e., the second section) of the trench in the longitudinal direction of the trench, and the connection region is provided at that side surface whose inclination angle is great. Such a structure can allow ions to be incident on the side surface of the trench at a relatively deep incidence angle when the connection region is formed by ion implantation of p-type impurity. Due to this, it is possible, for example, to lower accelerating energy that is imparted to the ions, and crystal defects generated within the semiconductor substrate can thereby be suppressed. On the other hand, in another section (i.e., the first section) of the trench in the longitudinal direction of the trench, which is a section where a channel is formed along the side surface of the trench, the inclination angle of the side surface in this section is relatively small. If the side surface of the trench is formed to be steep in a section where a channel is formed, mobility of carriers that pass through the channel can be increased.

DETAILED DESCRIPTION

According to an embodiment of the present disclosure, an opening width of the trench in the second section may be greater than an opening width of the trench in the first section. With greater opening width of the trench in the second section, ions are allowed to be incident more deeply on the side surface of the trench when the connection region is formed by ion implantation of p-type impurity. Due to this, it is possible, for example, to further lower accelerating energy that is imparted to the ions, and generation of crystal defects within the semiconductor substrate can be further suppressed.

According to an embodiment of the present disclosure, the trench may further comprise a third section where the connection region is not provided, and the third section may be located between the first section and the second section along the longitudinal direction of the trench. In this case, an opening width of the trench in the third section may be greater than the opening width of the trench in the first section, and an inclination angle of the side surface of the trench in the third section may be smaller than the inclination angle of the side surface of the trench in the second section. Such a configuration enlarges the side surface of the trench in which a channel is formed, and thus a resistance of the semiconductor device against a current (so-called on-resistance) can be reduced.

The opening width of the trench in the third section may be equal to the opening width of the trench in the second section, and the inclination angle of the side surface of the trench in the third section may be equal to the inclination angle of the side surface of the trench in the first section.

Such a configuration makes it possible to avoid giving the trench an overly complex shape, and at the same time, sufficiently enlarge the side surface of the trench in which a channel is formed.

According to an embodiment of the present disclosure, the semiconductor device may be a MOSFET. In this case, the semiconductor substrate may further comprise an n-type source region being in contact with the upper electrode, opposing the gate electrode via the gate insulator film and being separated from the drift layer by the body layer, and an n-type drain layer being in contact with the lower electrode and being separated from the body layer by the drift layer.

According to an embodiment of the present disclosure, the semiconductor device may be an IGBT. In this case, the semiconductor substrate may further comprise an n-type emitter region being in contact with the upper electrode, opposing the gate electrode via the gate insulator film and being separated from the drift layer by the body layer, and a p-type collector layer being in contact with the lower electrode and being separated from the body layer by the drift layer. Further, although not particularly limited, the semiconductor substrate may further include an n-type buffer layer located between the drift layer and the collector layer.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

A MOSFET 10 according to a first embodiment will be described with reference to the drawings. The MOSFET 10 according to the present embodiment belongs to, although not particularly limited thereto, power semiconductor devices and can be employed as a switching element of a converter and an inverter, for example, in an electric-powered vehicle. The term "electric-powered vehicle"

herein encompasses various types of vehicles whose wheels are driven by a motor, such as a hybrid vehicle, a fuel cell vehicle, and an electric vehicle.

Figure 1:
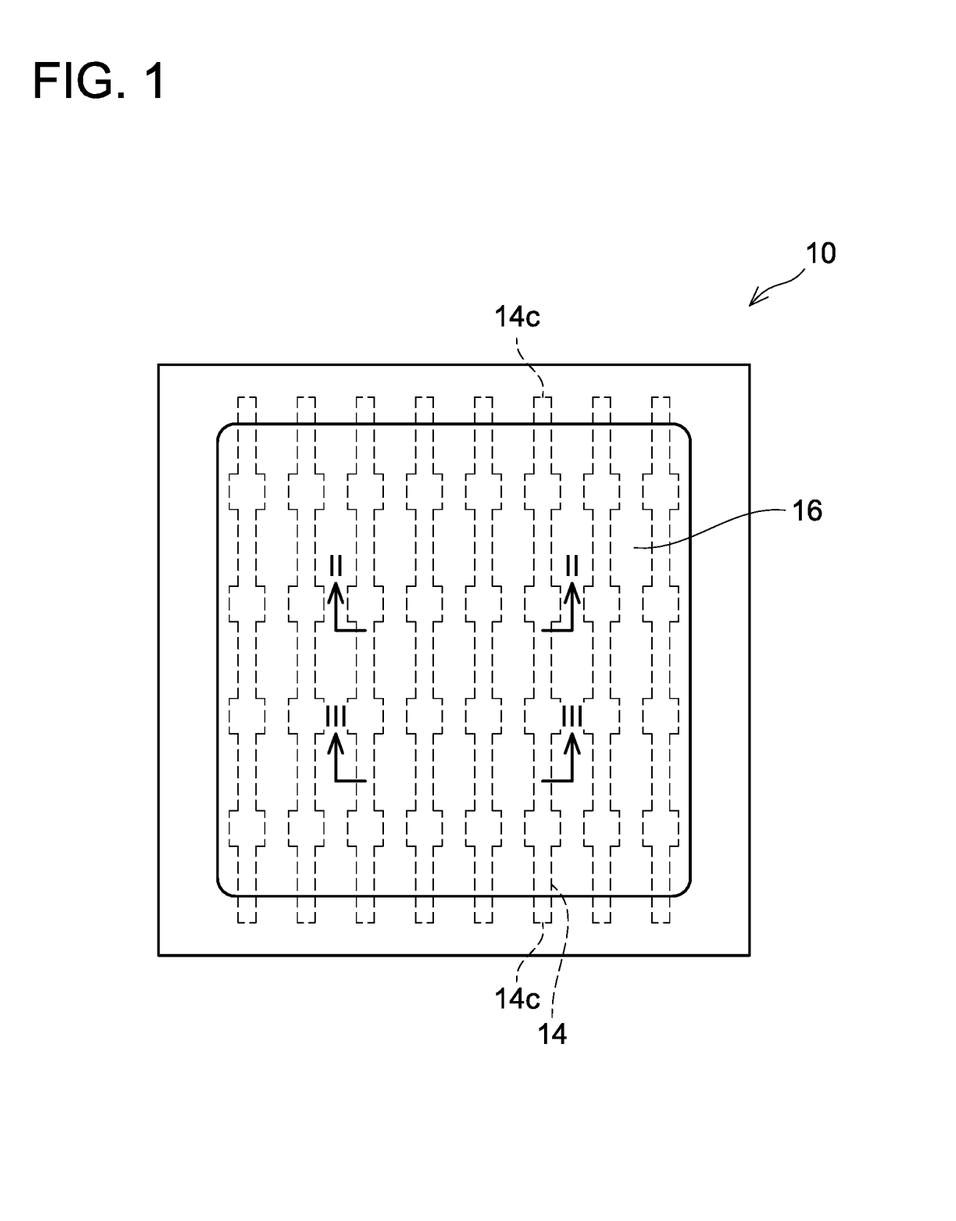
FIG. 1 is a planar view of a MOSFET 10 according to a first embodiment.
Figure 2:
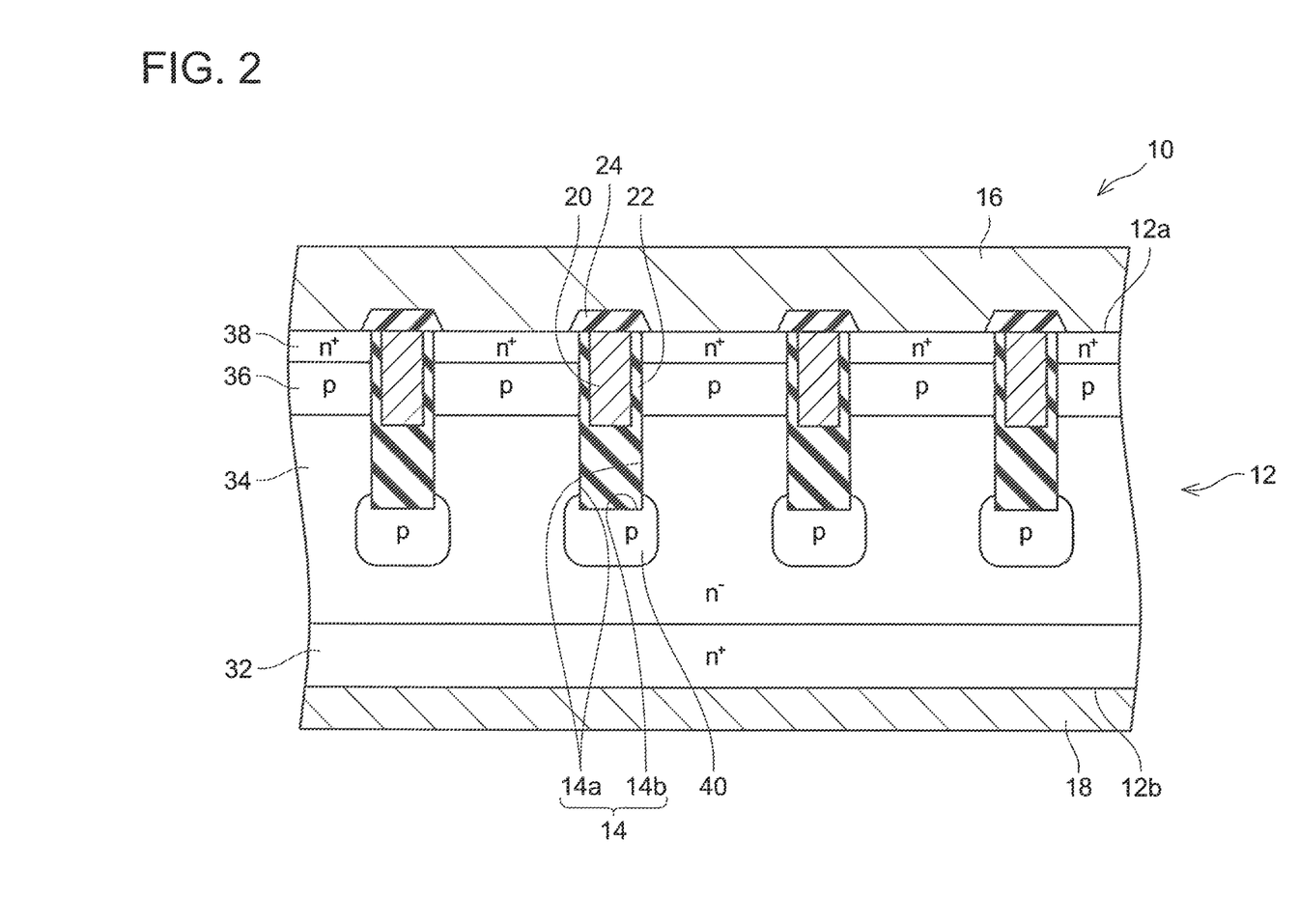
FIG. 2 is a cross-sectional view taken along a line II-II in FIG. 1 and shows a cross-sectional structure of the MOSFET 10 in a first section S1 of a trench 14.
Figure 3:
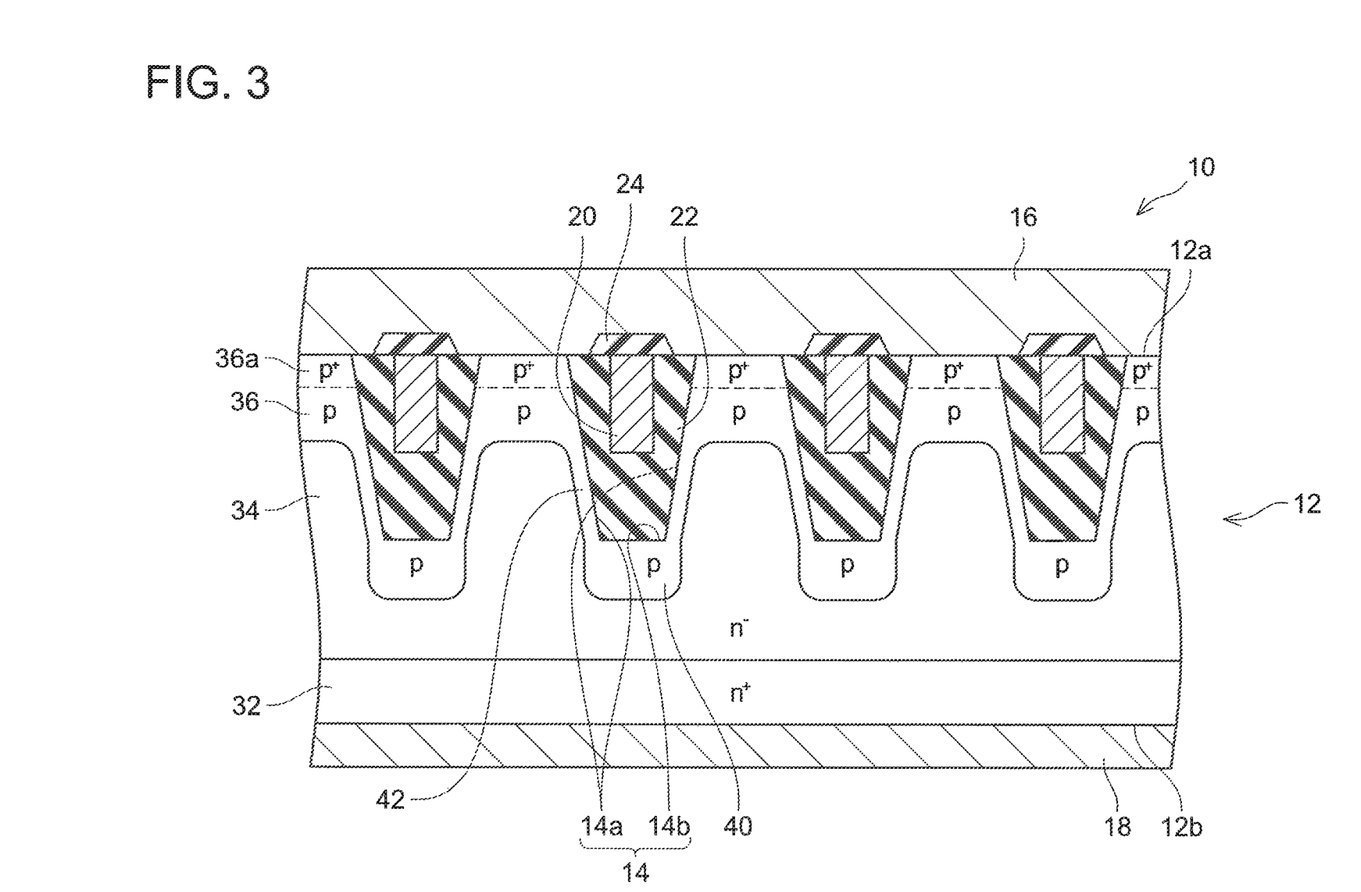
FIG. 3 is a cross-sectional view taken along a line III-III in FIG. 1 and shows a cross-sectional structure of the MOSFET 10 in a second section S2 of the trench 14.
Figure 4:
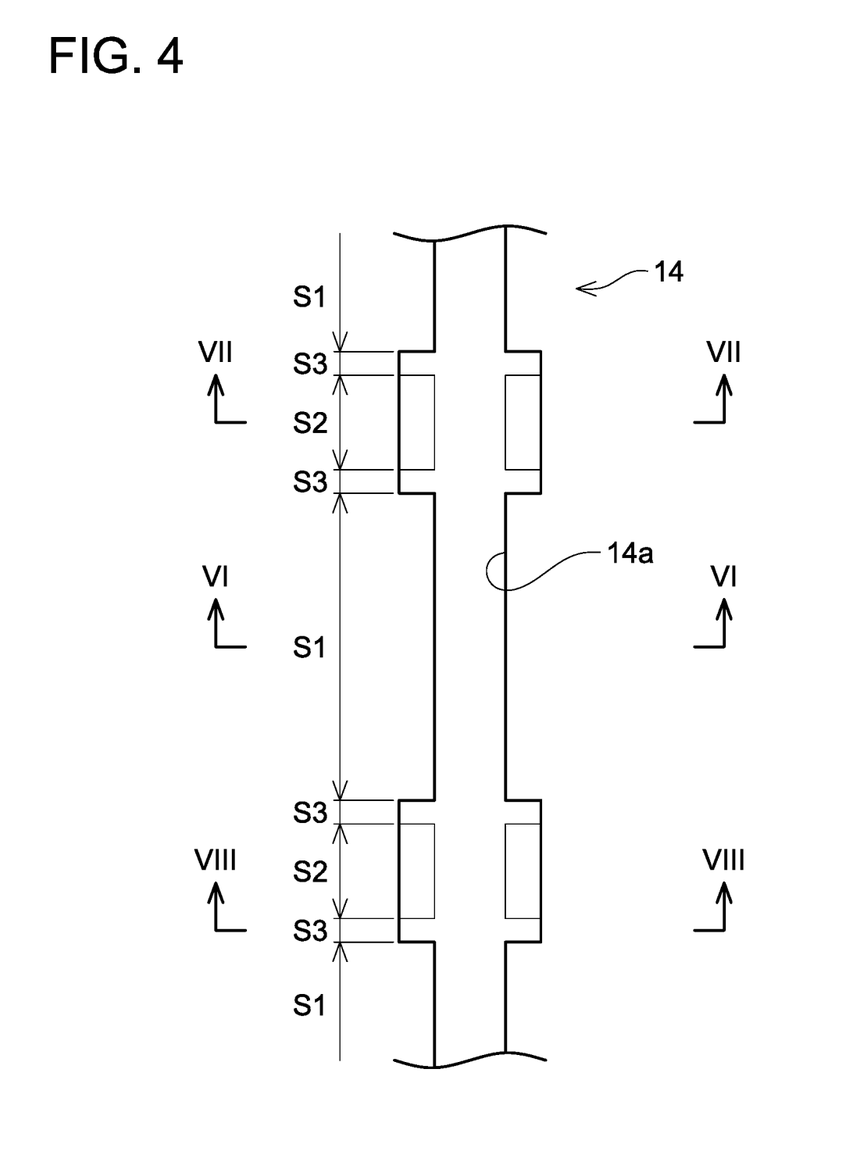
FIG. 4 schematically shows an opening shape of the trench 14 (i.e., trench in a planar view).

As shown in FIGS. 1, 2, and 3, the MOSFET 10 includes a semiconductor substrate 12, an upper electrode 16 provided on an upper surface 12a of the semiconductor substrate 12, a lower electrode 18 provided on a lower surface 12b of the semiconductor substrate 12, and a plurality of gate electrodes 20. A plurality of trenches 14 is provided in the upper surface 12a of the semiconductor substrate 12, and each of the gate electrodes 20 is provided within a corresponding one of the trenches 14 via a gate insulator film 22.

Here, the upper surface 12a of the semiconductor substrate 12 means one surface of the semiconductor substrate 12, and the lower surface 12b of the semiconductor substrate 12 means another surface of the semiconductor substrate 12 located opposite to the upper surface 12a. The expressions "upper surface" and "lower surface" as used herein are intended to distinguish, for descriptive purposes, between two surfaces located opposite to each other, and are not intended to limit orientation of the MOSFET 10 during manufacture and during use.

The semiconductor substrate 12 according to the present embodiment is a SiC substrate constituted of silicon carbide (SiC). However, the semiconductor substrate 12 is not limited to a SiC substrate, and may be a silicon (Si) substrate or a substrate (crystalline body) constituted of another semiconductor material. The upper electrode 16 and the lower electrode 18 are constituted of a material having electrical conductivity. Employable examples of this material include, although not particularly limited to, metallic materials such as Al (aluminum), Ni (nickel), Ti (titanium), and Au (gold). The upper electrode 16 and the lower electrode 18 are not limited to have any particular configuration. The upper electrode 16 is in ohmic contact with the upper surface 12a of the semiconductor substrate 12, and the lower electrode 18 is in ohmic contact with the lower surface 12b of the semiconductor substrate 12.

The gate electrodes 20 are constituted of a material having electrical conductivity, and an employable example of this material is polysilicon, for example. The gate insulator film 22 intervenes between each gate electrode 20 and inner surfaces 14a, 14b of its corresponding trench 14, and each gate electrode 20 is electrically insulated from the semiconductor substrate 12. The gate insulator films 22 are constituted of an insulating material such as silicon oxide. Further, an interlayer insulating film 24 is provided between each gate electrode 20 and the upper surface 16, and each gate electrode 20 is also electrically insulated from the upper electrode 16. The interlayer insulating film 24 is made of an insulating material such as silicon oxide.

As shown in FIGS. 2 and 3, the semiconductor substrate 12 includes a drain layer 32, a drift layer 34, a body layer 36, and a source region 38. The drain layer 32 is an n-type semiconductor region doped with n-type impurity (e.g., phosphorus). The drain layer 32 is located along the lower surface 12b of the semiconductor substrate 12 and is in contact with the lower electrode 18. An n-type impurity concentration in the drain layer 32 is sufficiently high, and the lower electrode 18 is in ohmic contact with the drain layer 32. It should be noted that the drain layer 32 is not limited to have any particular thickness or any particular n-type impurity concentration, and can be designed as appropriate.

The drift layer 34 is an n-type semiconductor region doped with n-type impurity. The drift layer 34 is stacked on the drain layer 32 and extends over an entirety of the semiconductor substrate 12. An n-type impurity concentration in the drift layer 34 is lower than the n-type impurity concentration in the drain layer 32. It should be noted that the drift layer 34 is not limited to have any particular thickness or any particular n-type impurity concentration, and can be designed as appropriate.

The body layer 36 is a p-type semiconductor region doped with p-type impurity (e.g., Al). The body layer 36 is stacked on the drift layer 34 and extends over the entirety of the semiconductor substrate 12. The body layer 36 is in contact with the upper electrode 16 at the upper surface 12a of the semiconductor substrate 12. Portions 36a (also referred to as "contact regions" or "body contact regions") of the body layer 36 that are in contact with the upper electrode 16 have a high p-type impurity concentration, so that the upper electrode 16 is in ohmic contact with the body layer 36. It should be noted that the body layer 36 is not limited to have any particular thickness or any particular p-type impurity concentration, and can be designed as appropriate.

The source region 38 is an n-type semiconductor region doped with n-type impurity. The source region 38 is provided along the upper surface 12a of the semiconductor substrate 12 and is in contact with the upper electrode 16. As a mere example, in the present embodiment, a plurality of the source regions 38 is provided in stripes, and each of the source regions 38 extends in a direction orthogonal to a longitudinal direction of the trenches 14. Therefore, at the upper surface 12a of the semiconductor substrate 12, the body layer 36 and the source regions 38 are alternately disposed along the longitudinal direction of the trenches 14, and both the body layer 36 and the source regions 38 are in contact with the upper electrode 16. Further, each of the source regions 38 is also disposed at a side surface 14a of the corresponding trench 14 and opposes the gate electrode 20 via the corresponding gate insulator film 22. Within the semiconductor substrate 12, the source regions 38 are surrounded by the body layer 36 and the source regions 38 are separated from the drift layer 34 by the body layer 36. An n-type impurity concentration in the source regions 38 is sufficiently high, and the upper electrode 16 is in ohmic contact with the source regions 38. It should be noted that the source regions 38 are not limited to have any particular shape or any particular n-type impurity concentration, and can be designed as appropriate.

The semiconductor substrate 12 further includes floating regions 40 and connection regions 42. Each of the floating regions 40 is a p-type semiconductor region doped with p-type impurity. Each of the floating regions 40 is located within the drift layer 34 and is provided along a bottom surface 14b of its corresponding trench 14. The floating regions 40 are provided together with the connection regions 42 (which will be described later) in order to suppress electric field strength near the bottom surfaces 14b of the trenches 14. It should be noted that the floating regions 40 are not limited to have any particular shape or any particular p-type impurity concentration, and can be designed as appropriate.

Each of the connection regions 42 is a p-type semiconductor region doped with p-type impurity. Each of the connection regions 42 extends between the body layer 36 and its corresponding floating region 40 along the side surface 14a of the corresponding trench 14. Due to this, each of the floating regions 40 is electrically connected to the upper electrode 16 via the corresponding connection region 42 and the body layer 36. Here, as can be understood from FIGS. 2 and 3, the connection regions 42 are provided only in a section of the trenches 14 in the longitudinal direction of the trenches 14. In other section, as shown in FIG. 2, no connection region 42 is provided and the gate electrodes 20 oppose the drift layer 34 via the gate insulator films 22. Due to this, in a section where no connection region 42 is provided, a channel through which carriers flow from the source regions 38 to the drift region 34 is formed when the MOSFET 10 is turned on.

Next, a structure of the trenches 14 will be described with reference to FIGS. 4 to 8. Each trench 14 according to the present embodiment includes a first section S1, a second section S2, and a third section S3 along the longitudinal direction of the trench 14 (i.e., along a vertical direction in FIGS. 1 and 4) in a planer view. It should be noted that the third section S3 is not necessarily needed, and it is sufficient so long as the trench 14 includes at least the first section S1 and the second section S2. Further, although a plurality of the second sections S2 is provided in the present embodiment, it is sufficient so long as the trench 14 includes at least one second section S2 at a position separated from both of longitudinal ends 12c (see FIG. 1) of the trench 14.

As previously stated, the connection region 42 is provided only in a section of the trench 14 in the longitudinal direction, and the second section S2 is the section where the connection region 42 is provided. On the other hand, the first section S1 is the section where the connection region 42 is not provided. That is, in the second section S2, the connection region 42 is provided along the side surface 14a of the trench 14 (see FIG. 3), while in the first section S1, the connection region 42 is not provided and the drift layer 34 is disposed at the side surface 14a of the trench 14 (see FIG. 2).

Figure 6:
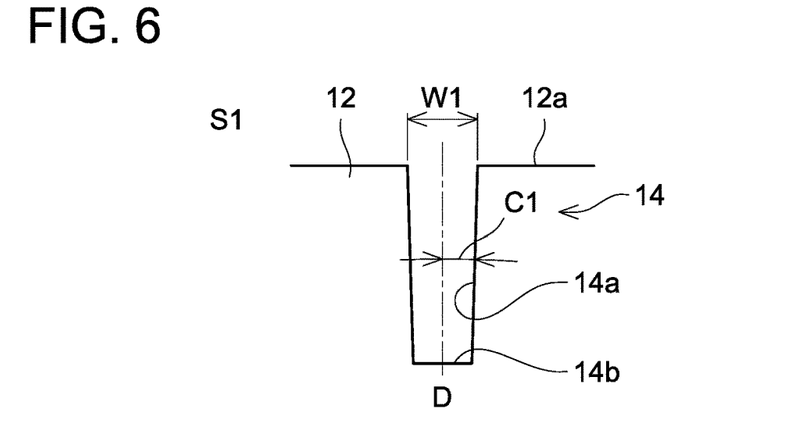
FIG. 6 is a cross-sectional view taken along a line VI-VI in FIG. 4 and shows a cross-sectional shape of the trench 14 in the first section S1.
Figure 7:
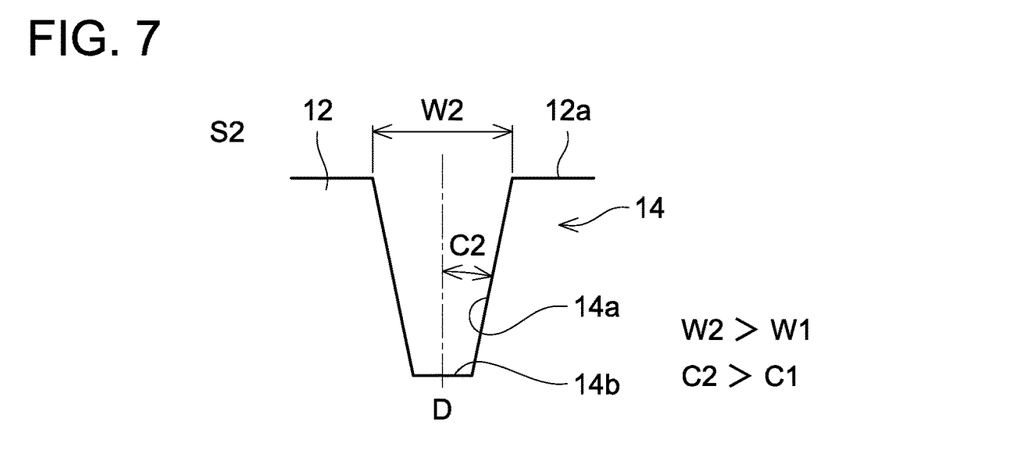
FIG. 7 is a cross-sectional view taken along a line VII-VII in FIG. 4 and shows a cross-sectional shape of the trench 14 in the second section S2.
Figure 8:
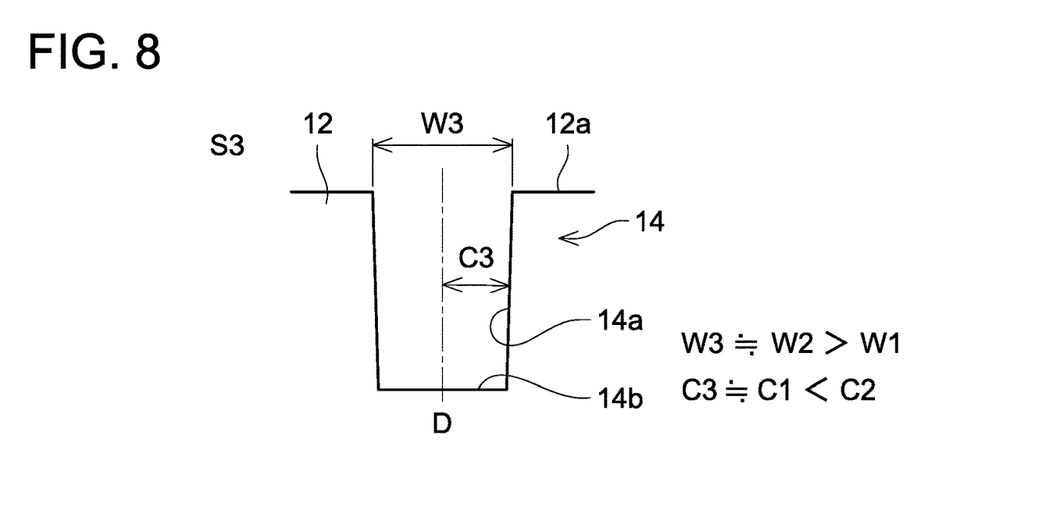
FIG. 8 is a cross-sectional view taken along a line VIII-VIII in FIG. 4 and shows a cross-sectional shape of the trench 14 in a third section S3.

As shown in FIGS. 6 and 7, when the first section S1 and the second section S2 are compared to each other, an inclination angle C1 of the side surface 14a of the trench 14 in the first section S1 and an inclination angle C2 of the side surface 14a of the trench 14 in the second section S2 are different from each other. Specifically, the inclination angle C2 in the second section S2 is greater than the inclination angle C1 in the first section S1. Here, an inclination angle of the side surface 14a of the trench 14 means an angle that the side surface 14a of the trench 14 forms with respect to a depth direction D of the trench 14. In particular, on the basis of the side surface 14a of the trench 14 being parallel to the depth direction D (that is, the inclination angle is zero), it is assumed that the inclination angle becomes greater as the side surface 14a of the trench 14 more inclines so as to face an upper surface 12a side of the semiconductor substrate 12.

In the MOSFET 10 according to the present embodiment, the inclination angle C2 of the side surface 14a of the trench 14 is great in a section (i.e., in the second section S2) of the trench 14 in the longitudinal direction and the connection region 42 is provided along that gently-inclined side surface 14a. Such a structure makes it possible to allow ions to be incident on the side surface 14a of the trench 14 at a relatively deep incidence angle (i.e., at a small incidence angle) when the connection region 42 is formed by ion implantation of p-type impurity. Due to this, for example, accelerating energy that is imparted to the ions can be lowered, and thereby crystal defects generated within the semiconductor substrate 12 can be suppressed.

On the other hand, in another section (e.g., in the first section S1) of the trench 14 in the longitudinal direction, which is a section where a channel is formed along the side surface 14a of the trench 14, the inclination angle C1 of the side surface 14a is relatively small. As a mere example, the side surface 14a of the trench 14 in the first section S1 may be substantially parallel to the depth direction D of the trench 14. That is, the inclination angle C1 in the first section S1 may be substantially zero. As such, with the steep side surface 14a of the trench 14 in the section where a channel is formed, the mobility of carriers that pass through the channel can be increased. Due to this, for example, an on-resistance of the MOSFET 10 can be reduced or maintained. It should be noted that since the second section S2 where the connection region 42 is provided is a section where a channel is not supposed to be formed, an increase in the inclination angle C2 of the side surface 14a of the trench 14 in that section does not particularly affect the on-resistance of the MOSFET 10.

In the MOSFET 10 according to the present embodiment, as shown in FIGS. 6 and 7, an opening width W2 of the trench 14 in the second section S2 is greater than an opening width W1 of the trench 14 in the first section S1 (i.e., W1<W2). As the opening width W2 of the trench 14 in the second section S2 becomes greater, ions are allowed to be incident on the side surface 14a of the trench 14 at a deeper incidence angle when the connection region 42 is formed by ion implantation of p-type impurity. Due to this, for example, the accelerating energy that is imparted to the ions can further be lowered, and thereby crystal defects generated within the semiconductor substrate 12 can further be suppressed.

Figure 5:
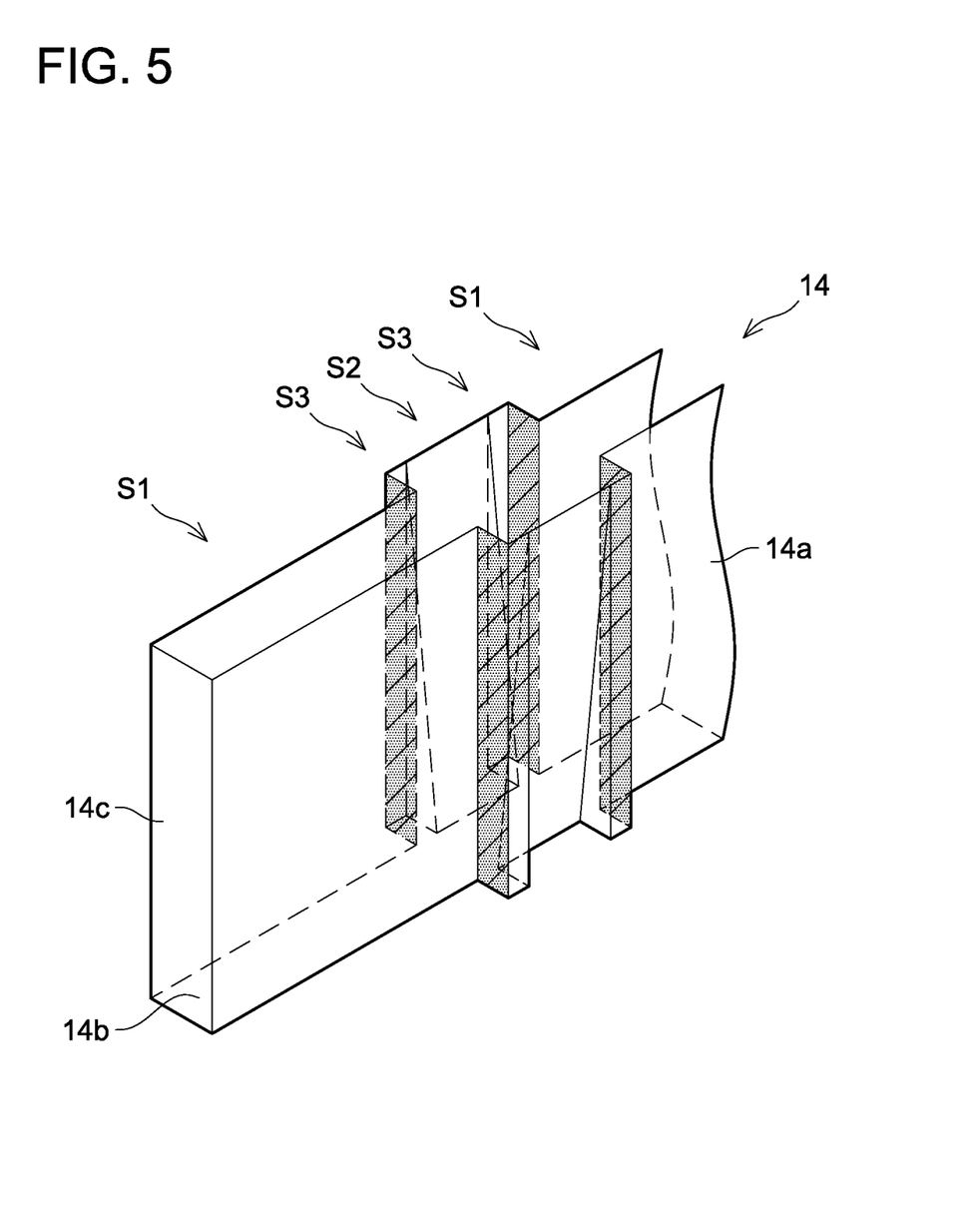
FIG. 5 is a perspective view schematically showing a shape of the trench 14.

In the MOSFET 10 according to the present embodiment, as previously stated, the trench 14 further includes the third section S3. The third section S3 is located between the first section S1 and the second section S2 along the longitudinal direction of the trench 14. The third section S3 is a section where the connection region 42 is not provided, and as with the first section S1, the third section S3 is a section where a channel is formed when the MOSFET 10 is turned on. Here, an opening width W3 of the trench 14 in the third section S3 is greater than the opening width W1 in the first section S1. Further, an inclination angle C3 of the side surface 14a of the trench 14 in the third section S3 is smaller than the inclination angle C2 in the second section S2. With such a configuration, the side surface 14a of the trench 14 in which a channel is formed is enlarged by providing the third section S3. Specifically, the side surface 14a of the trench 14 is enlarged by hatched parts in FIG. 5, and the hatched parts represent an area where the drift layer 34 is disposed at the side surface 14a of the trench 14 and a channel is formed when the MOSFET 10 is turned on. As such, by providing the trench 14 with the third section S3, the area where a channel is formed can be enlarged and the on-resistance of the MOSFET 10 can be reduced. It should be noted that the hatched parts in FIG. 5 represent a part of the side surface 14a of the trench 14 in the third section S3, and an inclination angle thereof is equal to the angle C3 shown in FIG. 8 and is relatively steep. Due to this, the mobility of carriers is also relatively high in a channel that is formed in the parts, and thus the on-resistance of the MOSFET 10 is effectively reduced. As a mere example, the side surface 14a of the trench 14 in the third section S3, including the hatched parts in FIG. 5, may be substantially parallel to the depth direction D of the trench 14. That is, the inclination angle C3 in the third section S3 may be substantially zero.

Although not particularly limited, the opening width W3 in the third section S3 may be equal to the opening width W2 in the second section S2. Further, the inclination angle C3 of the side surface 14a in the third section 33 may be equal to the inclination angle C1 in the first section S1. Such a configuration makes it possible to avoid giving the trench 14 an overly complex shape, and at the same time, sufficiently enlarge the side surface 14a of the trench 14 in which a channel is formed.

Figure 9:
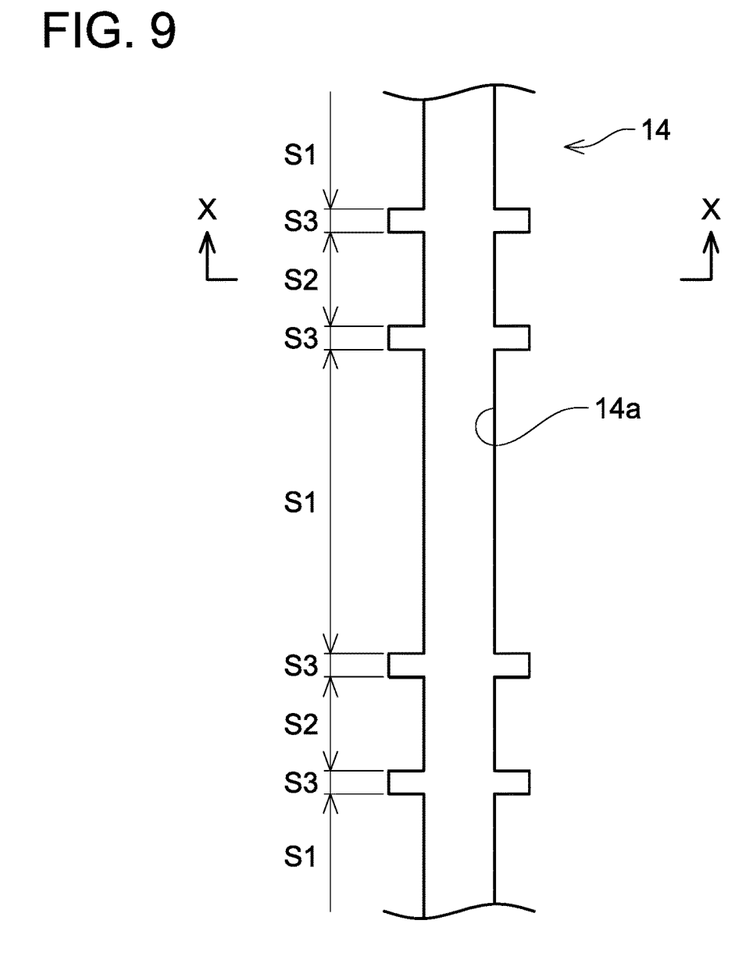
FIG. 9 is a diagram explaining a first step in an exemplary procedure for forming the trench 14.
Figure 10:
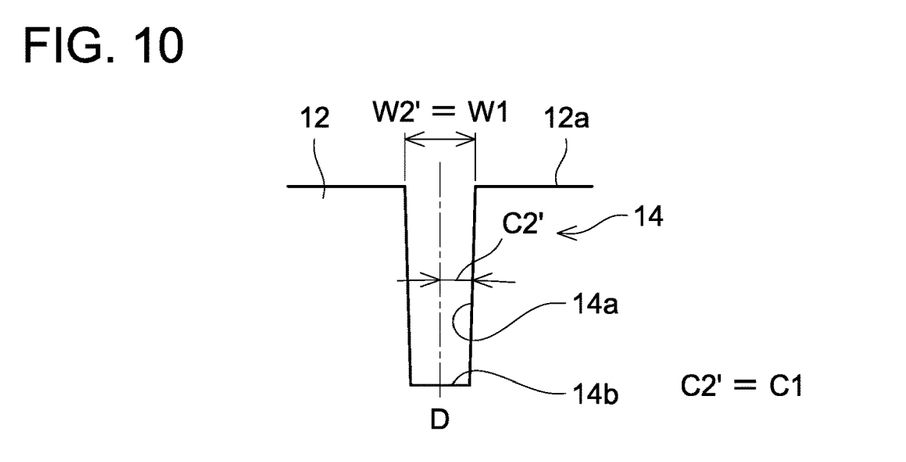
FIG. 10 is a cross-sectional view taken along a line X-X in FIG. 9 and shows a cross-sectional shape of the trench 14 in the second section S2 after the first step.

Next, an example of a procedure for forming each of the trenches 14 will be described with reference to FIGS. 9 to 12. First, the trench 14 is formed in the upper surface 12a of the semiconductor substrate 12 in a shape as shown in FIGS. 9 and 10. The trench 14 can be formed, for example, by thy etching. At this stage, the second section S2 is formed in the same shape as the first section S1. That is, an inclination angle C2' and an opening width W2' in the second section S2 may be the same as the inclination angle C1 and the opening width W1 in the first section S1. The trench 14 of such a shape can be formed by performing dry etching once. Here, the semiconductor substrate 12 may have the source regions 38 already formed therein prior to the formation of the trench 14. In this case, by forming the trench 14, the source regions 38 can be disposed at the side surface 14a of the trench 14.

Figure 11:
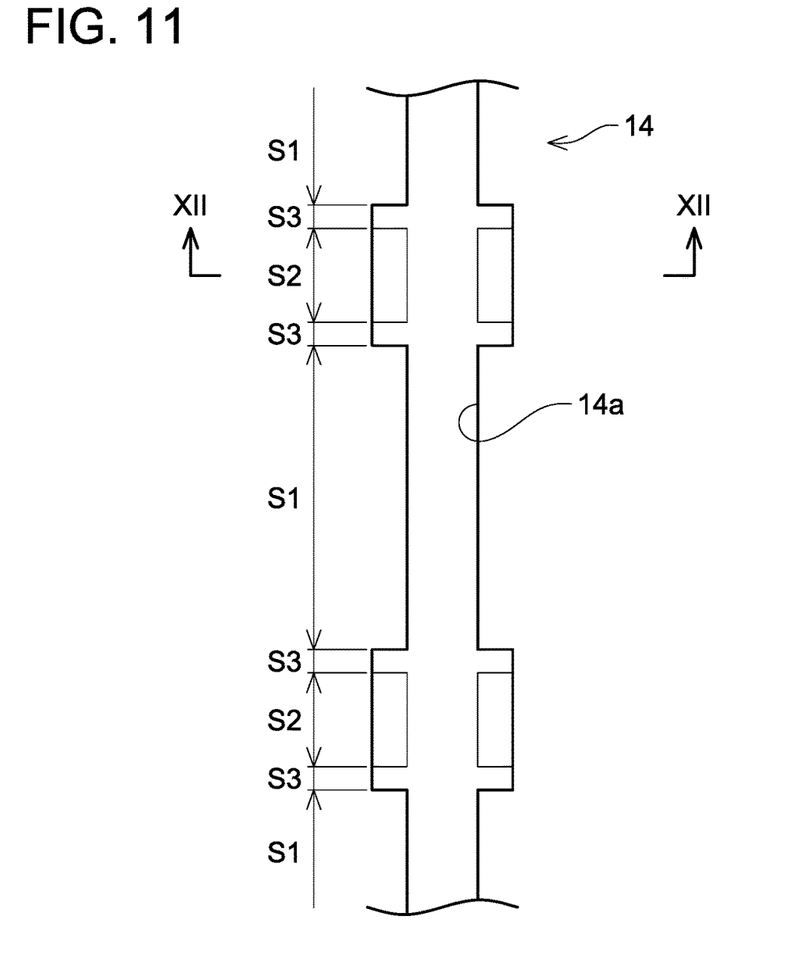
FIG. 11 is a diagram explaining a second step in the exemplary procedure for forming the trench 14.
Figure 12:
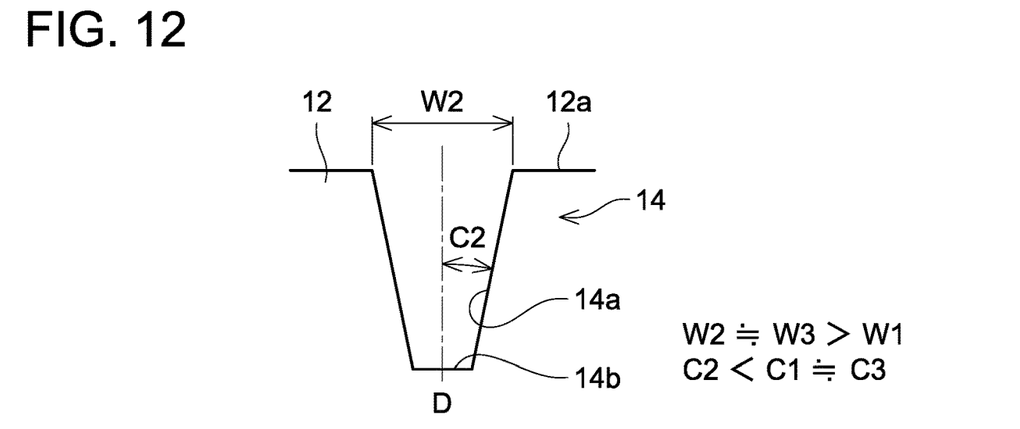
FIG. 12 is a cross-sectional view taken along a line XII-XII in FIG. 11 and shows a cross-sectional shape of the trench 14 in the second section S2 after the second step.

Then, as shown in FIGS. 11 and 12, the second section S2 is formed into a desired shape by performing dry etching again. That is, in the second section S2, the opening width W2' is enlarged and the inclination angle C2' of the side surface 14a is made greater. In this step, the first section S1 and the third section S3, which are already completed, may be masked by filling the entirety of the trench 14, for example, with silicon oxide and then removing the silicon oxide from the second section S2. Due to this, only the second section S2 of the trench 14 can be etched selectively. Further, the inclination angle C2 of the side surface 14a can be adjusted as appropriate by varying dry etching condition.

Second Embodiment

Figure 13:
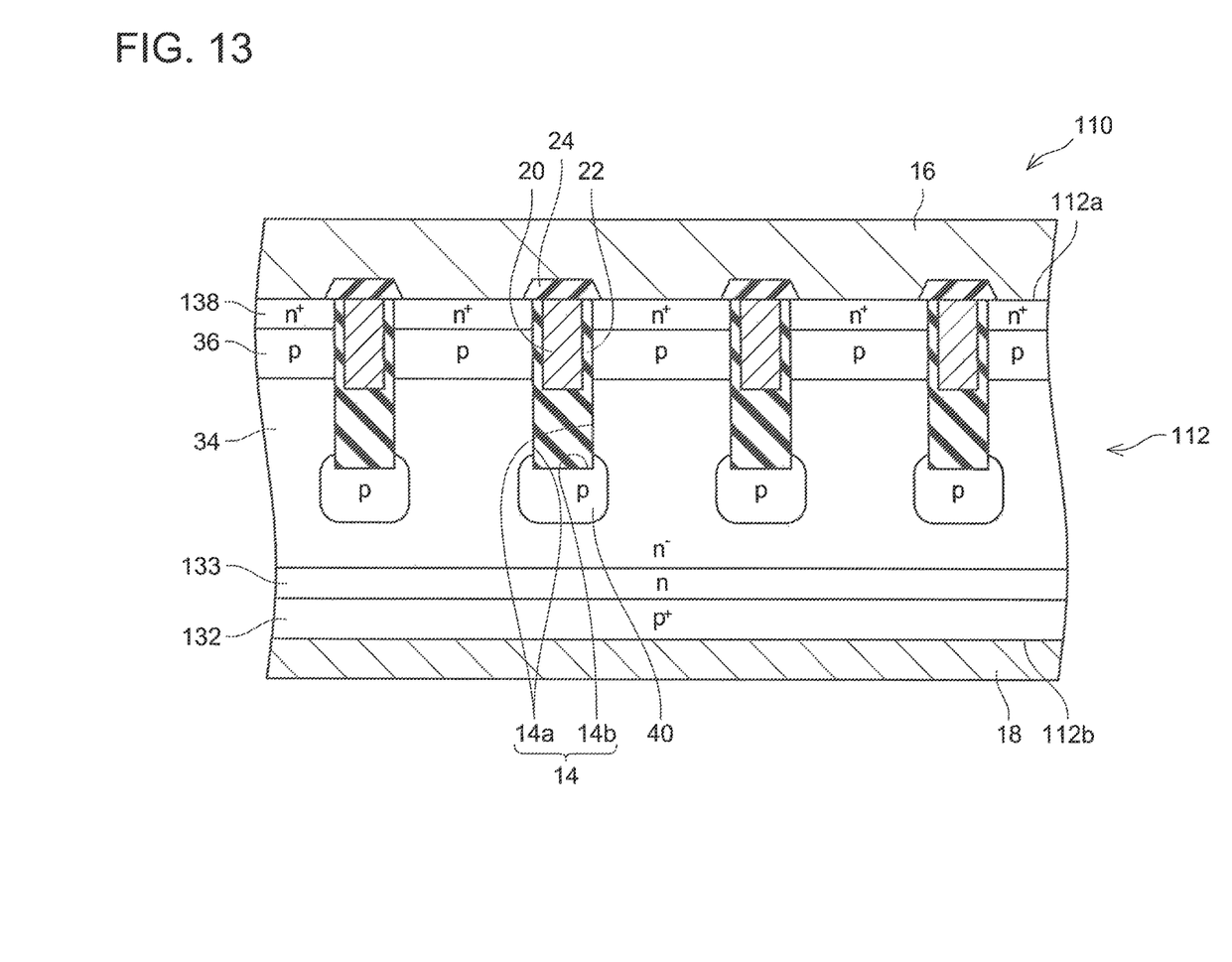
FIG. 13 shows a cross-sectional structure of an IGBT 110 according to a second embodiment, and in particular, shows a cross-sectional structure of the IGBT 110 in the first section S1 of the trench 14.
Figure 14:
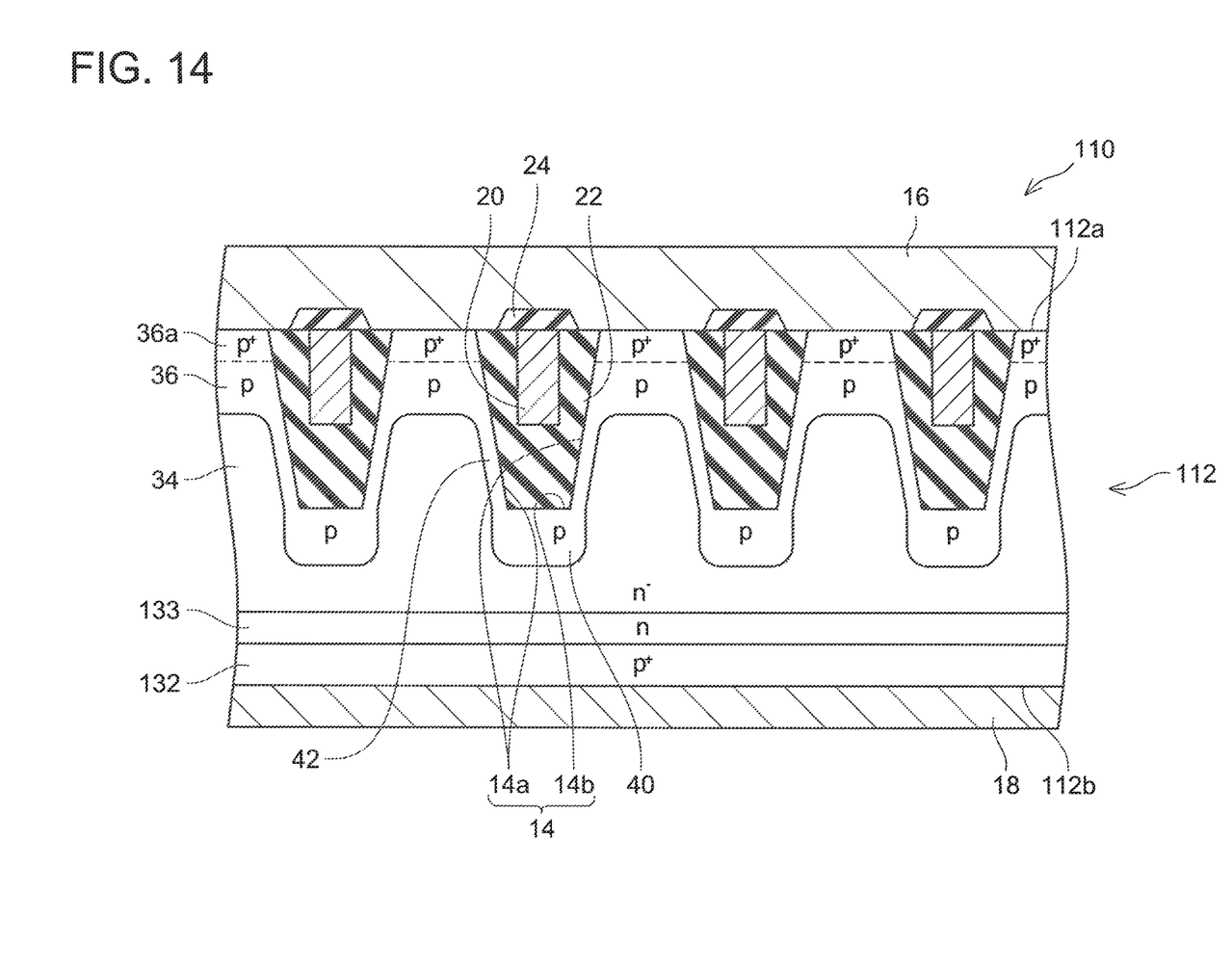
FIG. 14 shows a cross-sectional structure of the IGBT 110 according to the second embodiment, and in particular, shows a cross-sectional structure of the IGBT 110 in the second section S2 of the trench 14.

An IGBT 110 according to a second embodiment will be described with reference to FIGS. 13 and 14. The configuration of the trenches 14 in the aforementioned MOSFET 10 can be widely employed in trench-gate-type semiconductor devices. In the following, an example of application to the IGBT 110 will be described, and configurations of the IGBT 110 that are identical to those of the MOSFET 10 will be given the same signs and descriptions thereof will be omitted as appropriate.

As with the MOSFET 10 according to the first embodiment, the IGBT 110 includes a semiconductor substrate 112, the upper electrode 16 provided on an upper surface 112a of the semiconductor substrate 112, the lower electrode 18 provided on a lower surface 112b of the semiconductor substrate 112, and a plurality of the gate electrodes 20. A plurality of the trenches 14 is provided in the upper surface 112a of the semiconductor substrate 112, and each of the gate electrodes 20 is provided within a corresponding one of the trenches 14 via the gate insulator film 22.

As with the MOSFET 10 according to the first embodiment, the semiconductor substrate 112 includes the p-type body layer 36 being in contact with the upper electrode 16, the n-type drift layer 34 intervening between the body layer 36 and the lower electrode 18, the p-type floating region 40 located within the drift layer 34 and provided along the bottom surface 14b of each trench 14, and the p-type connection region 42 extending between the body layer 36 and its corresponding floating region 40 along the side surface 14a of each trench 14. As with the MOSFET 10 according to the first embodiment, each of the trenches 14 includes, along the longitudinal direction of the trench 14 in a planer view, the first section S1 where the connection region 42 is not provided and the second section S2 where the connection region 42 is provided. Moreover, the inclination angle C2 of the side surface 14a of the trench 14 in the second section S2 is greater than the inclination angle C1 of the side surface 14a of the trench 14 in the first section S1 (see FIGS. 4 to 8). In the present embodiment as well, the trench 14 further includes the third section S3, however, the third section S3 is not necessarily needed.

Meanwhile, as a difference from the MOSFET 10 according to the first embodiment, the semiconductor substrate 112 includes a p-type collector layer 132 in place of the drain layer 32 and an n-type emitter region 138 in place of the source region 38. The collector layer 132 is provided along the lower surface 112b of the semiconductor substrate 112 and is in contact with the lower electrode 18. A p-type impurity concentration in the collector layer 132 is sufficiently high, and the lower electrode 18 is in ohmic contact with the collector layer 132. Meanwhile, the emitter region 138 is provided along the upper surface 112a of the semiconductor substrate 112 and is in contact with the upper electrode 16. An n-type impurity concentration in the emitter region 138 is sufficiently high, and the upper electrode 16 is in ohmic contact with the emitter region 138. The emitter region 138 is different in name from the source region 38 according to the first embodiment, but may be the same in structure as the source region 38. The semiconductor substrate 112 further includes an n-type buffer layer 133 between the collector layer 132 and the drift layer 34. An n-type impurity concentration in the buffer layer 133 is higher than the n-type impurity concentration in the drift layer 34. It should be noted that the buffer layer 133 is not necessarily needed.

In the IGBT 110 described above as well, the trenches 14 and configurations related thereto are identical to those of the MOSFET 10 according to the first embodiment. Therefore, the operation and effects described in the first embodiment can be brought about. That is, the configuration of the IGBT 110 according to the present embodiment makes it possible to maintain or reduce the on resistance, and at the same time, easily form the connection regions 42 along the side surfaces 14a of the trenches 14.

What is claimed is:
1. A semiconductor device comprising:
a semiconductor substrate comprising a trench in an upper surface of the semiconductor substrate;
an upper electrode provided on the upper surface of the semiconductor substrate;
a lower electrode provided on a lower surface of the semiconductor substrate, the lower surface being located at an opposite side of the upper surface; and
a gate electrode provided within the trench via a gate insulator film,
wherein the semiconductor substrate comprises:
a p-type body layer being in contact with the upper electrode;
an n-type drift layer intervening between the body layer and the lower electrode;
a p-type floating region located within the drift layer and provided along a bottom surface of the trench; and
a p-type connection region extending between the body layer and the floating region along a side surface of the trench,
wherein the trench comprises, along a longitudinal direction of the trench in a planar view, a first section where the connection region is not provided and a second section where the connection region is provided, and an inclination angle of the side surface of the trench in the second section is greater than an inclination angle of the side surface of the trench in the first section.

2. The semiconductor device according to claim 1, wherein an opening width of the trench in the second section is greater than an opening width of the trench in the first section.

3. The semiconductor device according to claim 1, wherein
the trench further comprises a third section where the connection region is not provided,
the third section is located between the first section and the second section along the longitudinal direction,
an opening width of the trench in the third section is greater than the opening width of the trench in the first section, and
an inclination angle of the side surface of the trench in the third section is smaller than the inclination angle of the side surface of the trench in the second section.

4. The semiconductor device according to claim 3, wherein
the opening width of the trench in the third section is equal to the opening width of the trench in the second section, and
the inclination angle of the side surface of the trench in the third section is equal to the inclination angle of the side surface of the trench in the first section.

5. The semiconductor device according to claim 3, wherein the inclination angle of the side surface of the trench in the third section is zero.

6. The semiconductor device according to claim 1, wherein
the semiconductor device is a MOSFET, and
the semiconductor substrate further comprises:
an n-type source region being in contact with the upper electrode, opposing the gate electrode via the gate insulator film and being separated from the drift layer by the body layer; and
an n-type drain layer being in contact with the lower electrode and being separated from the body layer by the drift layer.

7. The semiconductor device according to claim 1, wherein
the semiconductor device is an IGBT, and
the semiconductor substrate further comprises:
an n-type emitter region being in contact with the upper electrode, opposing the gate electrode via the gate insulator film and being separated from the drift layer by the body layer; and
a p-type collector layer being in contact with the lower electrode and being separated from the body layer by the drift layer.

* * * * *